United States Patent
Sukegawa et al.

(10) Patent No.: US 6,806,158 B2
(45) Date of Patent: Oct. 19, 2004

(54) MIXED CRYSTAL LAYER GROWING METHOD AND DEVICE, AND SEMICONDUCTOR DEVICE

(75) Inventors: Takae Sukegawa, Kawasaki (JP); Hidekazu Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/288,515

(22) Filed: Nov. 6, 2002

(65) Prior Publication Data

US 2003/0162370 A1 Aug. 28, 2003

(30) Foreign Application Priority Data

Feb. 28, 2002 (JP) .................................. 2002-053533

(51) Int. Cl.$^7$ ........................................... H01L 21/8222
(52) U.S. Cl. ...................... 438/309; 438/350; 438/357
(58) Field of Search ...................... 257/85, 197, 592; 438/235, 309, 312, 317, 350, 357

(56) References Cited

U.S. PATENT DOCUMENTS 6,426,265 B1 * 7/2002 Chu et al. .................. 438/312

2002/0174827 A1 * 11/2002 Samoilov et al. ............. 117/84
2003/0213977 A1 * 11/2003 Toyoda et al. ............. 257/197

* cited by examiner

Primary Examiner—David A. Zarneke
Assistant Examiner—Asok Kumar Sarkar
(74) Attorney, Agent, or Firm—Westerman, Hattori, Daniels & Adrian, LLP (57) ABSTRACT

When a silicon-germanium mixed crystal layer is grown on a substrate by introducing a silicon source gas, a germanium source gas, a boron source gas, and a carbon source gas into a reaction chamber, the flow rate of the carbon source gas is set at 5 sccm or higher and the supply concentration of the carbon source gas is set as low as approximately 1.0% under the condition that the silicon-germanium mixed crystal layer is doped with carbon with a concentration of approximately 0.5%; resulting in, carbon with a concentration required to inhibit the diffusion of boron is doped into the layer and the concentration of carbon becomes equal to or higher than the concentration of boron in a region at any given depth.

13 Claims, 11 Drawing Sheets

FIG. 11
PRIOR ART

MIXED CRYSTAL LAYER GROWING METHOD AND DEVICE, AND SEMICONDUCTOR DEVICE

CROSS-REFERENCE TO RELATED APPLICATIONS

This application is based upon and claims priority of Japanese Patent Application No. 2002-053533, filed on Feb. 28, 2002, the contents being incorporated herein by reference.

BACKGROUND OF THE INVENTION

1. Field of the Invention

The present invention relates to mixed crystal layer growing method and device, and a semiconductor device, and, for example, it is suitable for use in the vapor phase epitaxial growth of a silicon-germanium mixed crystal layer doped with carbon and boron as a base layer of a heterojunction bipolar transistor.

2. Description of the Related Art

The formation of a high-concentration and thinned base layer is indispensable to obtain a higher-speed bipolar transistor used in an IC.

In recent years, attention is being given to a heterojunction bipolar transistor HBT in which a silicon-germanium ($Si_{(1-x)}Ge_x$) mixed crystal layer is used as a base layer from the hope of its application to a silicon bipolar device, a superlattice device, and the like. To put such an HBT to practical use, a technique of vapor phase epitaxially growing the silicon-germanium mixed crystal layer on a silicon substrate is under study.

In the HBT in which the silicon-germanium mixed crystal layer is used as the base layer, the injection of carriers from an emitter to a base can be made larger compared with a homojunction bipolar transistor, whereby a ratio $h_{FE}$ of a collector current to a base current in a grounded-emitter DC operation can be secured without increasing base resistance and base transit distance.

Generally, in the fabrication of an npn-type HBT, the technology of forming a dope layer in situ by the use of a doping gas while the silicon-germanium mixed crystal layer is being formed by a CVD method is effective. Diborane gas ($B_2H_6$) is sometimes used as a boron (B) source gas for the growth of the silicon-germanium mixed crystal layer which becomes a p-type base layer.

Moreover, it is thought that in a heat process after the formation of the base layer, the doping of carbon (C) is effective in inhibiting an increase in base width (a reduction in concentration) accompanying TED (Transient Enhanced Diffusion) of boron.

However, when the silicon-germanium mixed crystal layer is doped with boron and carbon in addition, desired concentrations of these impurities in the layer can not be sometimes obtained for some factor. As a result, when carbon, for example, is not sufficiently doped into a desired region, the diffusion of boron occurs in the heat process after the formation of the base layer, which sometimes causes a problem that the base transit distance, concentration, and emitter/base junction position can not be controlled, or the like.

SUMMARY OF THE INVENTION

The present invention is made in view of the aforementioned problem, and its object is to enable the effective inhibition of the diffusion of an impurity such as boron by doping an impurity such as carbon into a desired region with high precision when a silicon-germanium mixed crystal layer is grown.

Mixed crystal layer growing method and device of the present invention target mixed crystal layer growing method and device for growing a silicon-germanium mixed crystal layer on a substrate placed in a reaction chamber by introducing source gases into the reaction chamber. When the silicon-germanium mixed layer is grown using a silicon source gas, a germanium source gas, a first impurity source gas such as boron, and a second impurity source gas such as carbon for inhibiting the diffusion of a first impurity in the mixed crystal layer, the concentration of a second impurity is equal to or higher than the concentration of the first impurity in a region at any given depth of the silicon-germanium mixed crystal layer.

Moreover, a semiconductor device of the present invention targets a semiconductor device having a silicon-germanium mixed crystal layer, for example, a semiconductor device in which a bipolar transistor formed with a base layer, an emitter layer, and a collector layer is constructed on a semiconductor substrate, and the silicon-germanium mixed crystal layer is provided as the base layer. Further, the silicon-germanium mixed crystal layer is doped with a first impurity such as boron and a second impurity such as carbon for inhibiting the diffusion of the first impurity, and the concentration of the second impurity is equal to or higher than the concentration of the first impurity in a region at any given depth of the silicon-germanium mixed crystal layer.

DETAILED DESCRIPTION OF THE PREFERRED EMBODIMENTS

Various embodiments of mixed crystal layer growing method and device, and a semiconductor device of the present invention will be explained below with reference to the drawings.

Operational Principle of the Present Invention

The present inventors have reached a conclusion that an impurity such as carbon can be doped into a desired region with high precision by growing a silicon-germanium mixed crystal layer based on the undermentioned operational principle as a result of earnest examination.

In the growth processing of the silicon-germanium mixed crystal layer, the details of which will be described later, a silicon source gas, a germanium source gas, a boron source gas, and a carbon source gas are introduced into a reaction chamber in which vapor phase epitaxial growth processing is performed via one gas supply pipe.

The concentration of the impurity such as carbon is required to be in a lower range, and hence the flow rate of its source gas is set in a lower range. As a result, the impurity can not be sufficiently doped into the desired region depending on the length of the gas supply pipe and the like, which causes a fear that its concentration in the layer becomes lower than a desired concentration. It is thought that this is because response delay occurs before the arrival of the source gas whose flow rate is controlled at a low flow rate at the reaction chamber via the gas supply pipe, and thereby the impurity is doped into the layer, delayed from a desired doping position.

Meanwhile, it is necessary to regulate the doping concentration of carbon into the silicon-germanium mixed crystal layer at a predetermined concentration, and hence such response delay as described above can not be solved only by simply increasing the flow rate of the carbon source gas.

Accordingly, as in the undermentioned respective embodiments, when the silicon-germanium mixed crystal layer is grown, the flow rate of the carbon source gas is set in a higher range and its supply concentration is set in a lower range under the condition that the doping concentration of carbon into the layer is regulated at the predetermined concentration.

First Embodiment

The first embodiment of the mixed crystal layer growing method and device, and the semiconductor device of the present invention will be explained with reference to FIGS. 1 to 9. First, referring to FIGS. 2 to 4, an example of a method of fabricating an npn-type heterojunction bipolar transistor HBT will be explained. As shown in FIG. 2A, an n-type impurity such as phosphorus is ion-implanted into a surface layer of a p-type silicon semiconductor substrate 101 to form an $n^+$ diffusion region 102. This $n^+$ diffusion region 102 comes to function as a collector layer.

Subsequently, a field oxide film 103 is formed in an element isolation region of the semiconductor substrate 101 by a so-called LOCOS method, and an active region 104 is formed. Thereafter, a silicon oxide film 105 is formed on the entire surface by a CVD method, and after a polycrystalline silicon film 106 is formed thereon by the CVD method, a silicon oxide film 107 is further formed thereon by the CVD method.

Figure 2A:
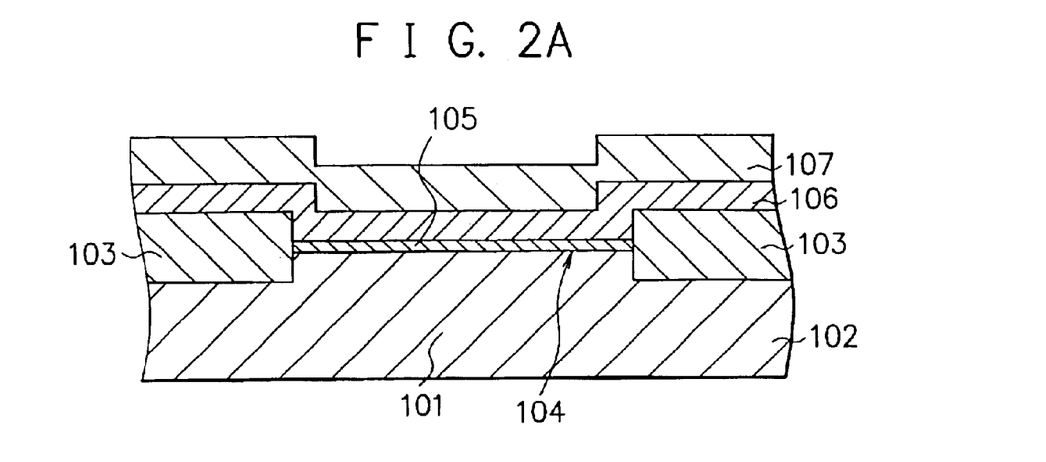
FIG. 2A to FIG. 2C are schematic sectional views showing a method of fabricating a heterojunction bipolar transistor of the embodiment in the order of process steps.
Figure 2B:
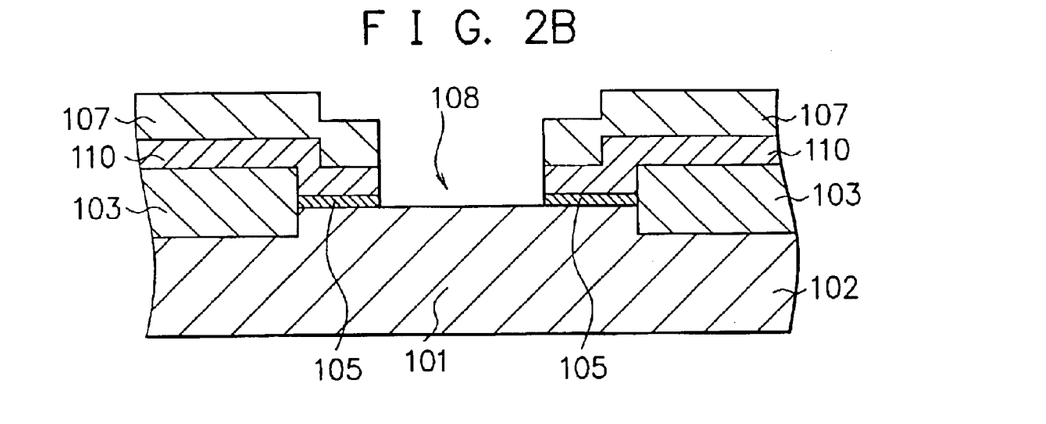

Then, as shown in FIG. 2B, a region, in which a base layer is to be formed, of a multiplayer film composed of the silicon oxide film 105, the polycrystalline silicon film 106, and the silicon oxide film 107 is worked by photolithography and subsequent dry etching, and thereby a base opening 108 for exposing a part of the surface of the $n^+$ diffusion region 102 is pattern-formed. The polycrystalline silicon film 106 is a lead-out layer 110 of the base layer formed in a subsequent process step.

Figure 2C:
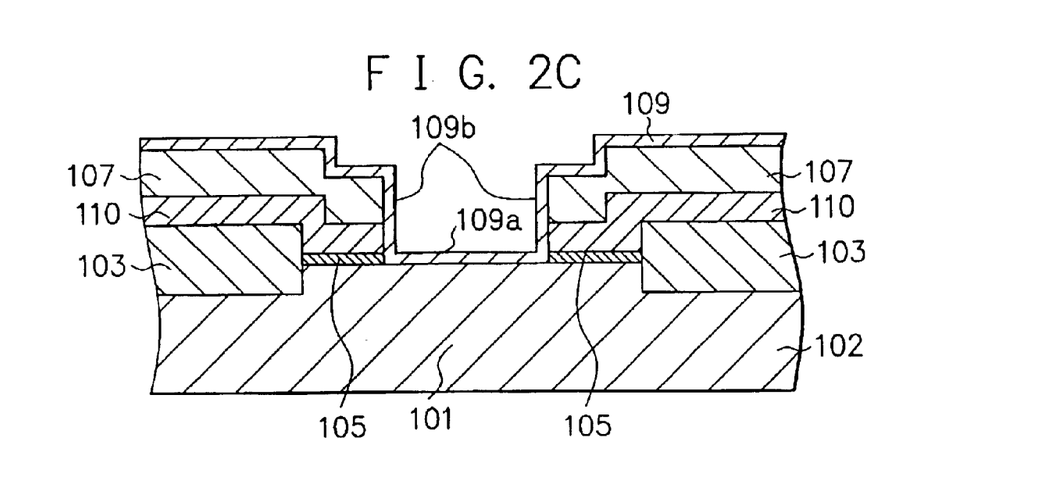

Thereafter, as shown in FIG. 2C, a silicon-germanium mixed crystal layer 109 is vapor phase epitaxially grown on the entire surface of the silicon oxide film 107 so as to cover a bottom portion and an inner wall of the base opening 108. At this time, in the silicon-germanium mixed crystal layer 109, a bottom portion 109a covering the surface of the $n^+$ diffusion region 102 exposed at the bottom of the base opening 108 is formed to be single-crystalline and the other portions (including a sidewall portion 109b of the silicon-germanium mixed crystal layer 190 formed in a subsequent process step) are formed to be polycrystalline in a self-alignment manner. Incidentally, the details of the vapor phase epitaxial growth processing of the silicon-germanium mixed crystal layer 109 will be described later.

Figure 3A:
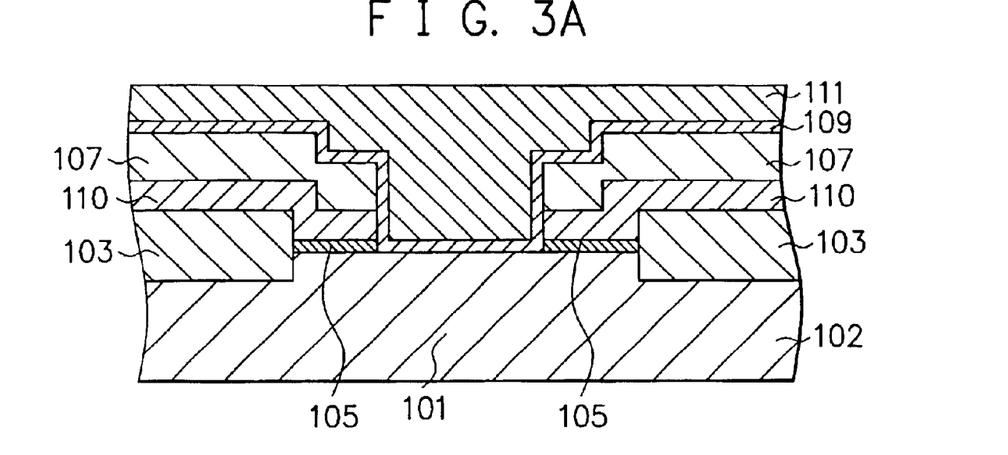
FIG. 3A to FIG. 3C are schematic sectional views showing the method of manufacturing the heterojunction bipolar transistor of the embodiment in the order of process steps.

Subsequently, as shown in FIG. 3A, a photoresist 111 as a mask material is applied onto the entire surface so as to have a thickness enough to fill up the base opening 108.

Figure 3B:
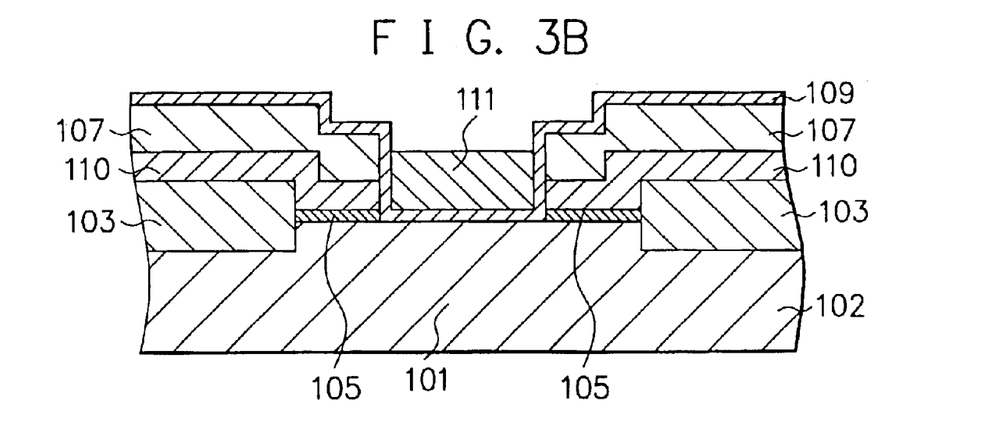

Thereafter, as shown in FIG. 3B, the entire surface of the photoresist 111 is subjected to anisotropic etching so that the photoresist 111 is left only at a predetermined depth of the base opening 108.

Figure 3C:
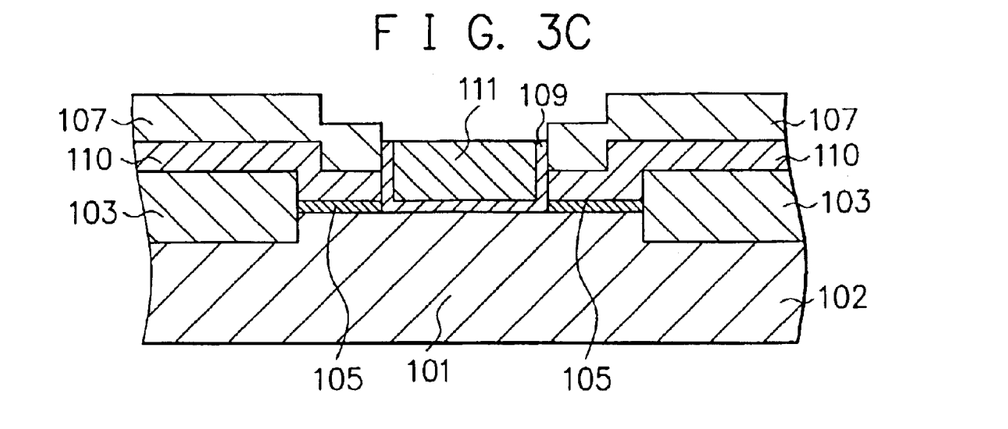

Then, as shown in FIG. 3C, the silicon-germanium mixed crystal layer 109 is subjected to anisotropic dry etching with the photoresist 111 as a mask so that the silicon-germanium mixed crystal layer 109 is left to the depth equivalent to that of the phtoresist 111 only in the base opening 108.

Figure 4A:
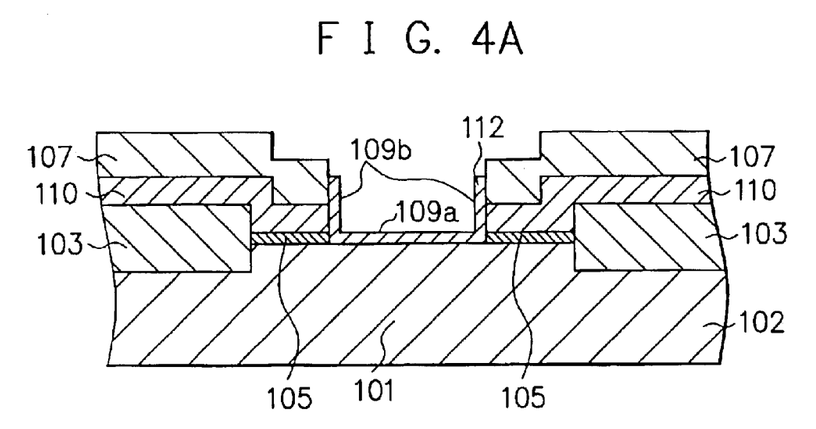
FIG. 4A to FIG. 4C are schematic sectional views showing the method of fabricating the heterojunction bipolar transistor of the embodiment in the order of process steps.

As shown in FIG. 4A, by removing the photoresist 111 by ashing or the like, a base layer 112 integrally composed of the single-crystalline flat bottom portion 109a and the polycrystalline sidewall portion 109b perpendicular to the bottom portion 109a is formed. The base layer 112 is electrically connected to the base lead-out layer 110 via the sidewall portion 109b.

Figure 4B:
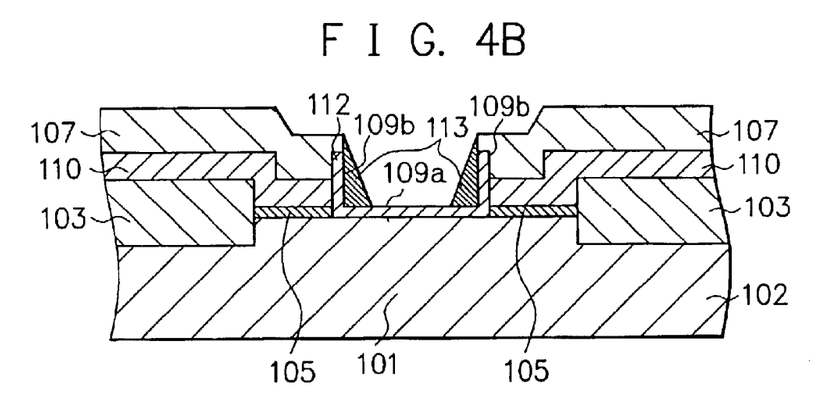

Subsequently, as shown in FIG. 4B, by depositing a silicon oxide film on the entire surface by the CVD method and subjecting this entire surface to anisotropic etching (etch back), the surface of a center portion of the bottom portion 109a of the base layer 112 is exposed, and a sidewall 113 which covers the remaining bottom portion 109a, the sidewall portion 109b, and the silicon oxide film 107 is formed. The base opening 108 of the base layer 112 is formed into a taper by the sidewall 113.

Figure 4C:
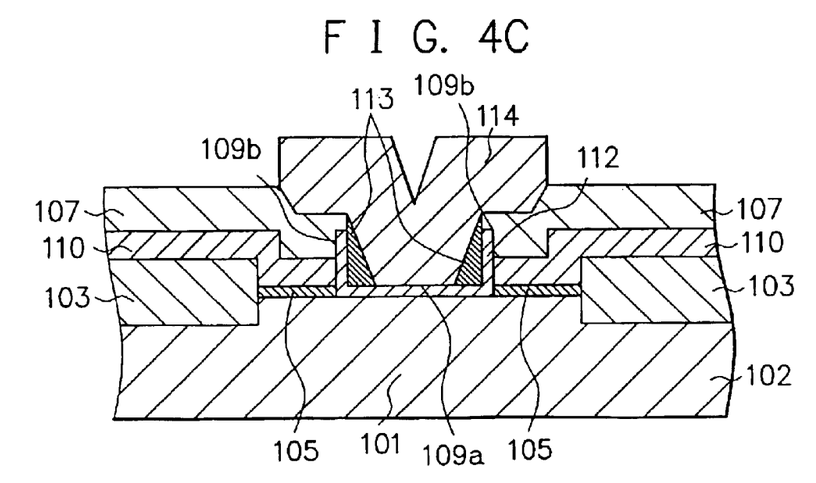

Then, as shown in FIG. 4C, an n-type polycrystalline silicon film or an amorphous silicon film is deposited on the entire surface by the CVD method and worked by photolithography and subsequent dry etching to form an emitter layer 114 which is connected to the bottom portion 109a of the base layer 112 at its bottom portion. At this time, by heat effect and subsequent heat treatment when the n-type polycrystalline silicon film or the amorphous silicon film is deposited, a part of an n-type impurity contained therein is diffused over a surface layer of the bottom portion 109a of the base layer 112, and thereby a shallow junction is formed. Hence, the more certain connection between the base layer 112 and the emitter layer 114 is performed.

Thereafter, the HBT of this embodiment is brought to completion through the formation of an interlayer dielectric, a wiring layer, and so on.

The vapor phase epitaxial growth processing of the silicon-germanium mixed crystal layer 109 which becomes the base layer 112 of the HBT will be explained below.

Figure 1:
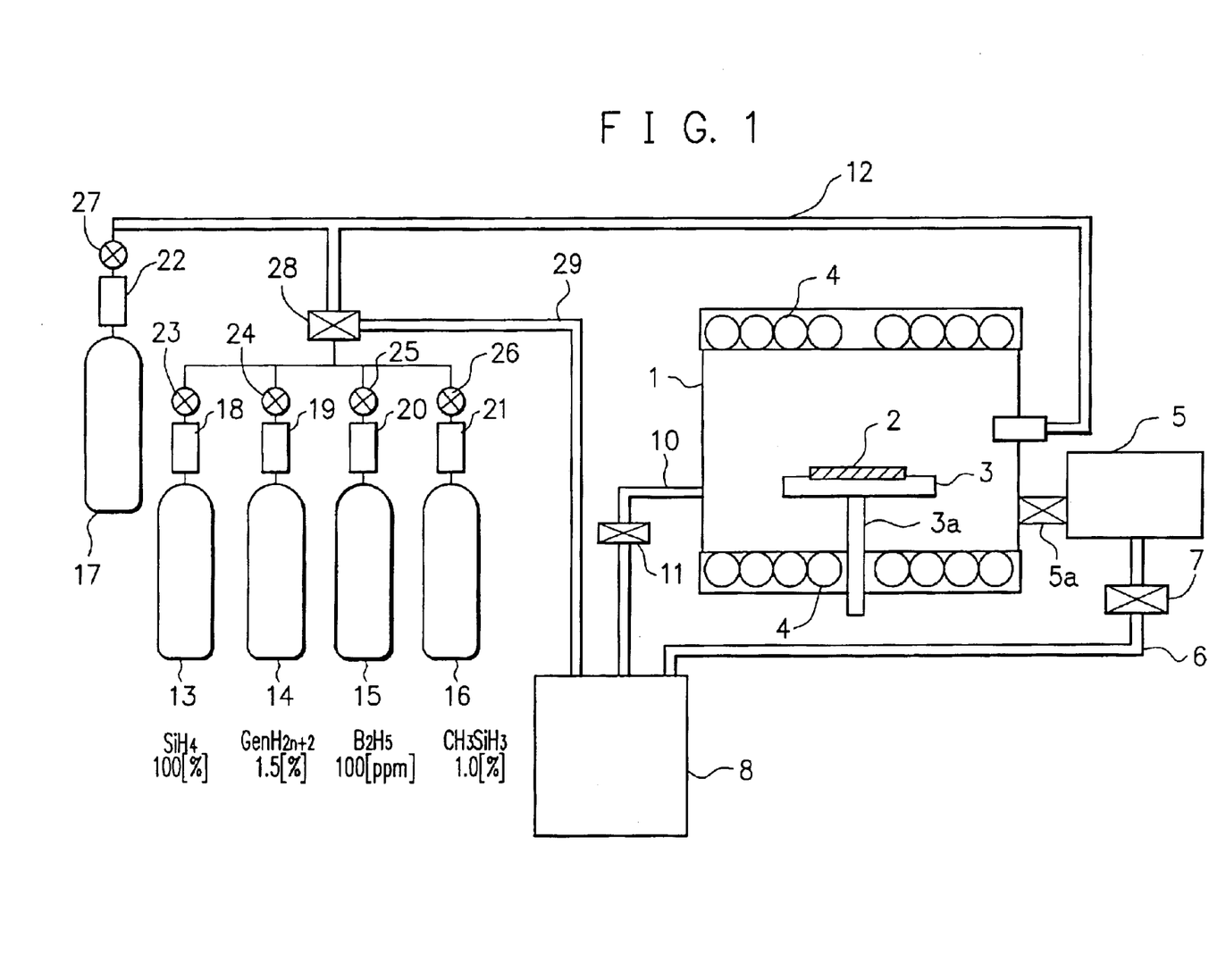
FIG. 1 is a diagram showing the schematic structure of a mixed crystal layer growing device of a first embodiment.

With reference to FIG. 1, the schematic structure of the silicon-germanium mixed crystal layer growing device will be explained. A susceptor 3 as a substrate holding unit for mounting a substrate 2 thereon is placed in a reaction chamber 1 made of quartz, and this sesceptor 3 is rotatable by a rotating shaft 3a. Tungsten-halogen lamps 4 being a heating unit for heating the substrate 2 are placed in a ceiling portion and a floor portion of the reaction chamber 1.

Moreover, a vacuum load lock chamber 5 and a wafer transfer chamber are provided, and connected to the reaction chamber 1 via a gate valve 5a. The vacuum load lock chamber 5 is connected to a dry pump 8, which is a pressure reducing unit for performing vacuum exhaust, via a pipe 6 and a valve 7 for pressure reduction. Further, the reaction chamber 1 is connected to the dry pump 8 via a pipe 10 and a valve 11 for exhaust.

A gas supply pipe 12 is connected to the reaction chamber 1, and to the gas supply pipe 12, a gas cylinder 13, a massflow controller 18, and a valve 23 which compose a silicon (Si) source gas supply unit, a gas cylinder 14, a massflow controller 19, and a valve 24 which compose a germanium (Ge) source gas supply unit, a gas cylinder 15, a massflow controller 20, and a valve 25 which compose a boron (B) source gas supply unit, and a gas cylinder 16, a massflow controller 21, and a valve 26 which compose a carbon (C) source gas supply unit are connected in parallel via a valve 28. The valve 28 is connected to the dry pump 8 via a gas exhaust pipe 29, and selects whether to supply the respective source gases to the reaction chamber 1 via the gas supply pipe 12 or exhaust them. In this example, boron is used, but phosphorous can be used, instead.

Furthermore, a gas cylinder 17, a massflow controller 22, and a valve 27 which compose a unit for supplying hydrogen gas ($H_2$) as a carrier gas are connected to the gas supply pipe 12.

In the device structured as above, the diameter of the gas supply pipe 12 is approximately 0.635 cm (¼ in.), and its length from the valve 28 to the reaction chamber 1 is 1.5 m or longer. One of the reasons why the length of the gas supply pipe 12 is 1.5 m or longer is because of the structure of the device including the relation of arrangement between the reaction chamber 1 and the respective source gas supply units and the like, and the acquisition of a distance enough to mix the respective source gases thoroughly.

Moreover, in this embodiment, monosilane ($SiH_4$) is used as the silicon source gas, and the gas concentration of the gas cylinder 13 is set at 100%. Germane ($Ge_nH_{2n+2}$) is used as the germanium source gas, and the gas concentration of the gas cylinder 14 is set at 1.5%. Diborane ($B_2H_6$) is used as the boron source gas, and the gas concentration of the gas cylinder 15 is set at 100 ppm. Methylsilane ($CH_3SiH_3$) is used as the carbon source gas, and the gas concentration of the gas cylinder 16 is set at 1.0%.

Next, the procedure for vapor phase epitaxially growing the silicon-germanium mixed crystal layer 109 will be explained. As shown in FIG. 2B, before the growth of the silicon-germanium mixed crystal layer 109, three layers of the silicon oxide film 105, the polycrystalline silicon film 106, and the silicon oxide film 107 are formed on the silicon semiconductor substrate 101, and a part of the surface of the silicon semiconductor substrate 101 is exposed from the base opening 108.

Incidentally, in this embodiment, blanket growth will be explained as an example. In the blanket growth, a uniform silicon-germanium mixed crystal epitaxial layer similar to an ordinary silicon epitaxial layer except for the growth temperature can be easily grown. However, it is necessary to remove unnecessary portions after the growth.

First, in order to remove organic matters and particles adhering to the silicon semiconductor substrate 101 and the like, cleaning treatment is performed under a temperature of approximately 40° C. with SC1 ($H_2O_2/NH_4OH/H_2O=2/1/110$). Metallic contaminants and a natural oxide film formed on the silicon surface of the base opening 108 are then removed by a cleaning fluid containing hydrogen fluoride (HF) diluted at approximately 5%. Thereafter, drying is performed with isopropyl alcohol (IPA) under normal pressure or reduced pressure.

On the other hand, after the vacuum load lock chamber 5 is controlled at atmospheric pressure (the gate valve 5a is closed), the substrate in a state shown in FIG. 2B (hereinafter referred to as the substrate 2) is introduced into the vacuum load lock chamber 5 within ten minutes after the aforementioned IPA drying, and the valve 7 is opened so as to perform vacuum exhaust of the vacuum load lock chamber 5 by the dry pump 8.

Moreover, the valve 11 is opened so as to perform vacuum exhaust of the reaction chamber 1 by the dry pump 8, whereby the pressure in the reaction chamber 1 is regulated at approximately $1.1 \times 10^4$ Pa (80 Torr). Hydrogen gas is supplied to the reaction chamber 1 at a flow rate of approximately 20 mls via the gas supply pipe 12, the temperature of the reaction chamber 1 is increased to approximately 1170° C. by the tungsten-halogen lamps 4, and then hydrogen chloride gas (HCl) is supplied to clean the interior of the reaction chamber 1.

Thereafter, after the temperature of the reaction chamber 1 is decreased to approximately 550° C. while hydrogen gas is being supplied to the reaction chamber 1 at a flow rate of approximately 20 mls, the gate valve 5a is opened, the substrate 2 is placed on the susceptor 3, and then the gate valve 5a is closed.

Subsequently, after the pressure of the reaction chamber 1 is regulated at approximately $1.1 \times 10^4$ Pa (80 Torr) by performing the vacuum exhaust of the reaction chamber 1 while hydrogen gas is being supplied to the reaction chamber 1 at a flow rate of approximately 20 mls, the surface temperature of the substrate 2 is increased to approximately 800° C. to approximately 900° C. by the tungsten-halogen lamps 4, and the natural oxide film formed on the silicon surface is removed by hydrogen reduction. This removal processing of the natural oxide film is performed while the substrate 2 together with the susceptor 3 is being rotated.

Figure 5:
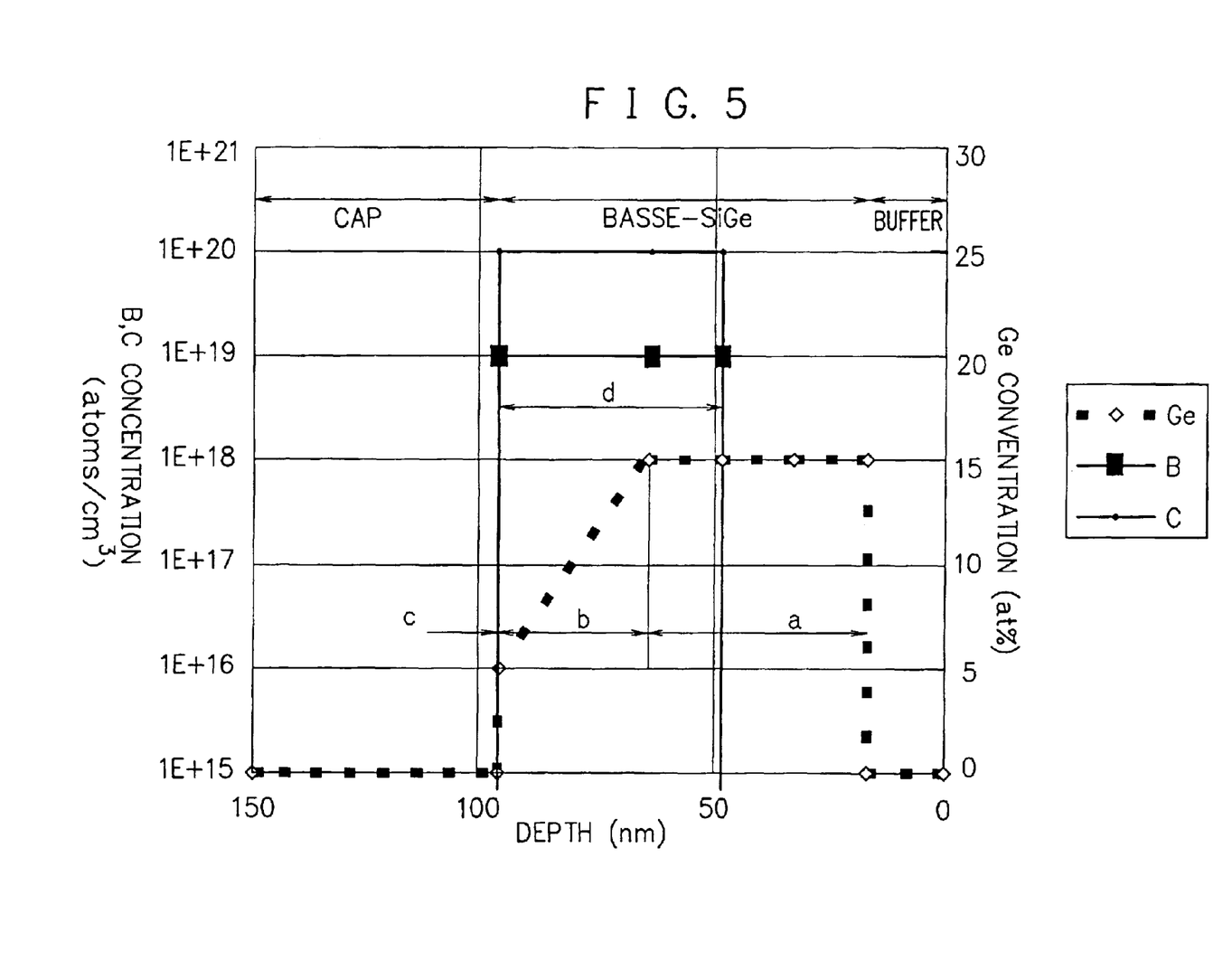
FIG. 5 is a diagram showing a profile of a silicon-germanium mixed crystal layer.

Thereafter, the bottom portion 109a of the silicon-germanium mixed crystal layer 109 is vapor phase epitaxially grown in accordance with a profile shown in FIG. 5. This growth processing of the mixed crystal layer is also performed while the substrate 2 together with the susceptor 3 is being rotated.

In this embodiment, as shown in FIG. 5, the silicon-germanium mixed crystal layer 109 is grown in accordance with the inclined profile in which the germanium (Ge) concentration is changed continuously from the collector layer side to the emitter layer side.

Namely, after a layer with uniform concentration in which the germanium (Ge) concentration is uniform at approximately 10% to 20% is formed (a region a in FIG. 5) so that the distorted state of the silicon-germanium mixed crystal layer is maintained, the germanium (Ge) concentration is gradually lowered toward the emitter layer side (a region b in FIG. 5), and thereafter lowered to 0% (a region c in FIG. 5).

With an increase in the composition percentage of germanium (Ge) on the collector layer side of the base layer, the base transit time tends to decrease. On the other hand, with an increase in the composition percentage of germanium (Ge) on the emitter layer side of the base layer, the base transit time tends to increase. Accordingly, by continuously lowering the germanium (Ge) concentration of the base layer from the collector layer side to the emitter layer side as stated above, the base transit time is shortened, which enables operation at high speed.

Further, boron (B) is doped until the germanium (Ge) concentration is lowered to 0% from the middle of the region where the germanium (Ge) concentration is uniform (a region d in FIG. 5). The boron (B) concentration is set at approximately $1\times10^{19}$ atoms/cm$^3$ to approximately $1\times10^{20}$ atoms/cm$^3$ from the relation between carrier concentration and mobility.

Furthermore, in a region into which boron (B) is doped, carbon (C) is doped at approximately $1\times10^{20}$ atoms/cm$^3$ to prevent the diffusion of the boron (B).

Thereafter, a cap silicon layer is formed. The cap silicon layer is necessary to control an emitter/base junction location so that emitter/base leakage does not occur and to inhibit the surface of the silicon-germanium mixed crystal layer from deteriorating.

In order to perform the growth processing in accordance with the aforementioned profile, while the supply of hydrogen gas to the reaction chamber 1 (at a flow rate of approximately 20 mls) and the vacuum exhaust of the reaction chamber 1 are continued, the surface temperature of the substrate 2 is lowered to approximately 700° C. by adjusting the tungsten-halogen lamps 4.

Then, in order to form a buffer layer, while the supply of hydrogen gas to the reaction chamber 1 (at a flow rate of approximately 20 mls) and the vacuum exhaust of the reaction chamber 1 are continued, 100% monosilne which is the silicon source gas is introduced via the gas supply pipe 12 to form a silicon film. At this time, the flow rate of the silicon source gas is controlled at approximately 50 sccm by the massflow controller 18, and the buffer layer is formed for a predetermined period of time.

Thereafter, to grow the silicon-germanium mixed crystal layer, the temperature within the reaction chamber 1 (the temperature of the substrate 2) is lowered to approximately 650° C. by adjusting the tungsten-halogen lamps 4, and 100% monosilane as the silicon source gas and 1.5% germane as the germanium source gas are introduced via the gas supply pipe 12. On this occasion, to obtain the mixed crystal layer with a desired composition percentage of germanium, while the flow rate of the silicon source gas is controlled at approximately 20 sccm by the massflow controller 18 and the flow rate of the germanium source gas is controlled at approximately 50 sccm by the massflow controller 19, the layer is formed for approximately 103 s.

Subsequently, while the introduction of the silicon source gas and the germanium source gas is continued, 100 ppm diborane as the boron source gas is introduced via the gas supply pipe 12. At this time, to obtain a concentration of approximately $1\times10^{19}$ atoms/cm$^3$ to approximately $1\times10^{20}$ atoms/cm$^3$, the boron source gas is diluted with hydrogen, and its flow rate is controlled at approximately 34 sccm by the massflow controller 20.

In this case, 1.0% methylsilane as the carbon source gas which is required to inhibit the diffusion, of boron is supplied earlier than diborane as the boron source gas by a period of time until the silicon-germanium mixed crystal layer with a thickness of approximately 2 nm to approximately 5 nm is formed, or approximately 25 s. At this time, the flow rate of the carbon source gas is controlled at approximately 9 sccm by the massflow controller 21.

Subsequently, to pass on to the growth of the region where the germanium concentration is inclined, the flow rate of 1.5% germane as the germanium source gas is continuously lowered by the massflow controller 24. In the meantime, the diluted diborane as the boron source gas and 1.0% methylsilane as the carbon source gas are introduced into the reaction chamber 1 without interruption.

Thereafter, the flow rate of 1.5% germane as the germanium source gas is controlled at 0 sccm, and simultaneously the flow rate of the diluted diborane as the boron source gas is controlled at 0 sccm. Incidentally, the 1.0% methylsilane as the carbon source gas is introduced into the reaction chamber 1 without changing its flow rate, and the silicon-germanium mixed crystal layer is grown so as to have a thickness of approximately 2 nm in a state in which the germanium (Ge) concentration is 0%.

Figure 6:
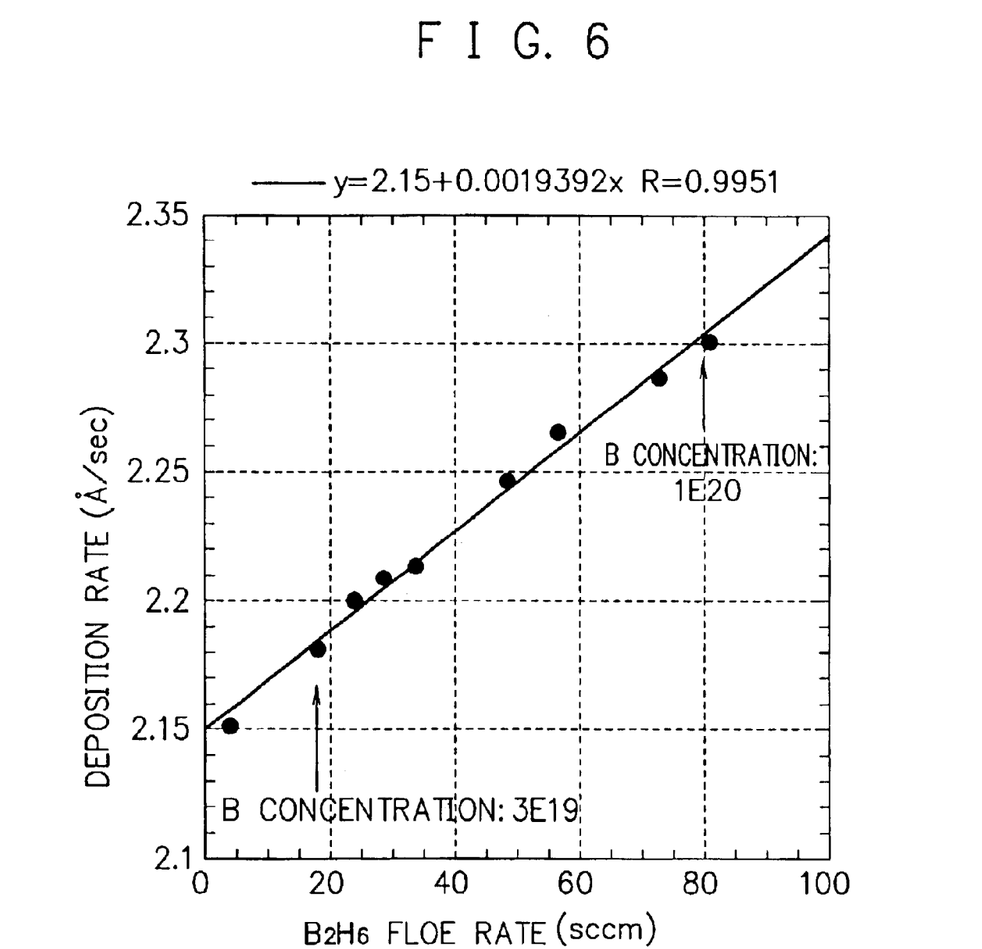
FIG. 6 is a characteristic diagram showing the relation between the deposition rate of the silicon-germanium mixed crystal layer and the flow rate of boron.

Incidentally, the base thickness needs to be controlled to determine base transit distance. It is confirmed that the deposition rate of the silicon-germanium mixed crystal layer depends on the concentration of boron, that is, the flow rate of boron as shown in FIG. 6. Although it is a weak correlation of approximately 1% or less per a boron concentration of $1\times10^{19}$ atoms/cm$^3$ under the condition that the carbon gas concentration is fixed at 0.15%, the deposition rate of the silicon-germanium mixed crystal layer increases in proportion to the boron concentration (boron flow rate), and hence in consideration of this point, the deposition time is set.

Then, to form the cap silicon layer, 100% monosilane as the silicon source gas is introduced via the gas supply pipe 12 while the temperature of the substrate is stabilized at approximately 700° C. by the tungsten-halogen lamps 4. At this time, the flow rate of the silicon source gas is controlled at approximately 50 sccm by the massflow controller 18, and the cap silicon layer is formed to have a thickness of approximately 50 nm.

According to the process in this embodiment described above, the silicon-germanium mixed crystal layer can be doped with carbon with a concentration of approximately 0.15%. Accordingly, an increase in base width (a reduction in concentration) accompanying TED (Transient Enhanced Diffusion) of boron in a heat process after the formation of the base layer can be inhibited. Incidentally, to fully inhibit the diffusion of boron, a carbon concentration of approximately 0.3% is ideal, but it is also possible to set the carbon concentration higher. However, the higher the carbon concentration, the more the transistor characteristics deteriorate, and consequently, the carbon concentration is set at 0.5% or lower.

Figure 7:
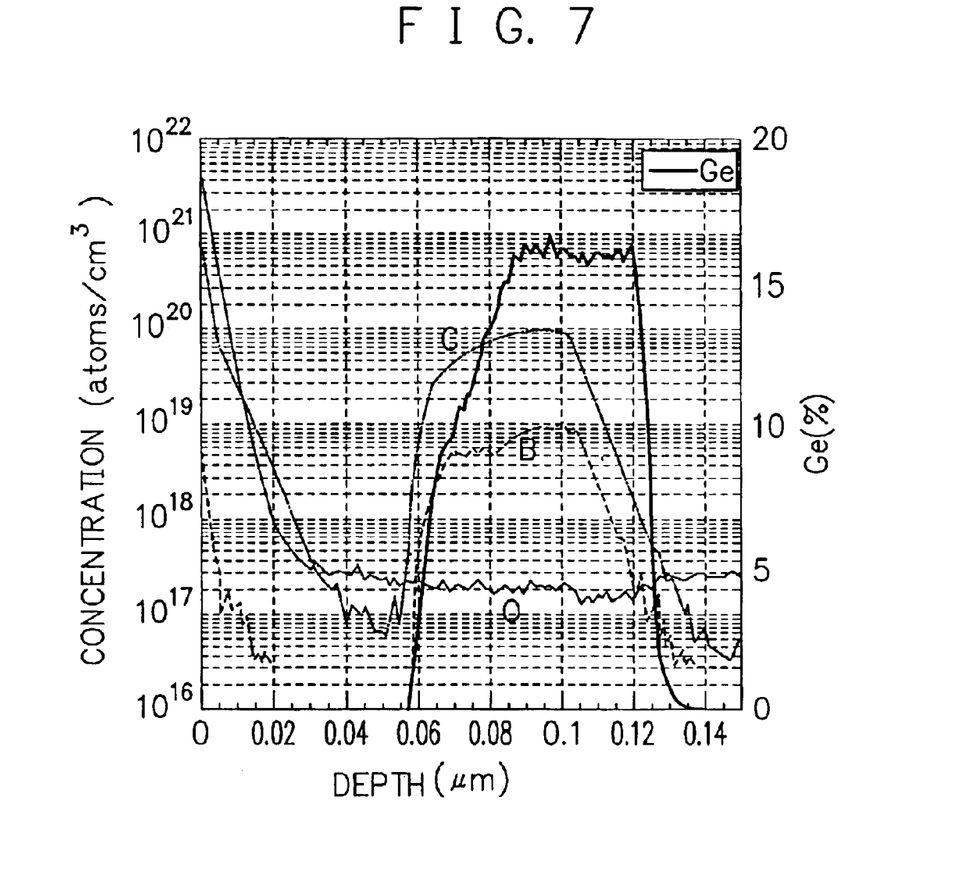
FIG. 7 is a diagram showing an SIMS analysis result of the silicon-germanium mixed crystal layer of this embodiment.

Moreover, according to the process in this embodiment, as shown by an SIMS analysis result in FIG. 7, the occurrence of a difference in doping depth between the dopings of carbon (C) and boron (B) into the silicon-germanium mixed crystal layer is prevented, so that the carbon concentration is higher than the boron concentration in a region at any given depth of the silicon-germanium mixed crystal layer, whereby the diffusion of boron in the heat process after the formation of the base layer can be effectively inhibited, and, for example, the base transit distance, concentration, and emitter/base junction position can be accurately controlled. It should be noted that the same effect can be obtained also by making the carbon concentration equal to the boron concentration.

Figure 11:
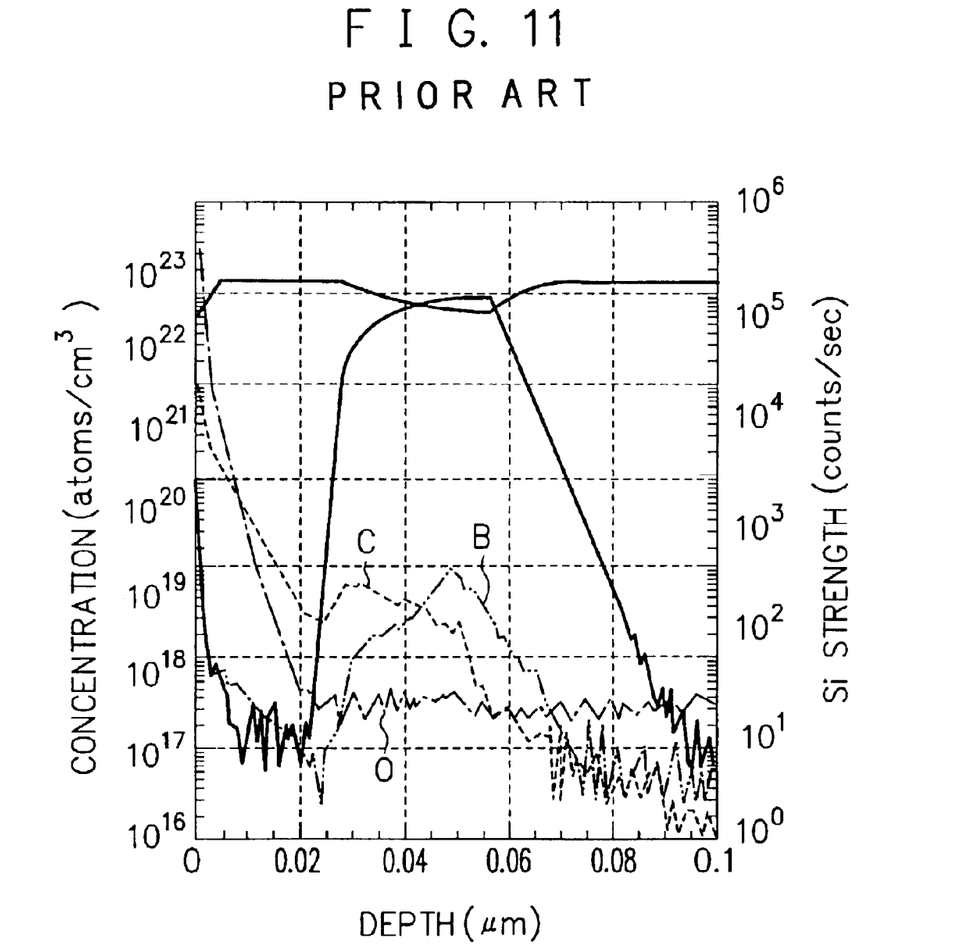
FIG. 11 is a diagram showing an SIMS analysis result of a silicon-germanium mixed crystal layer of a conventional example.

FIG. 11 shows an SIMS analysis result showing that a difference in doping depth between the dopings of carbon (C) and boron (B) into the layer occurs. This result is obtained from a case where the diameter of the gas supply pipe is approximately 0.635 cm (¼ in.) and the length thereof is 1.5 m or longer as in the first embodiment, but the gas concentration of the gas cylinder of methylsilane as the carbon source gas is 10% and the flow rate of the carbon source gas is controlled at approximately 5 sccm by the massflow controller 21. Moreover, the carbon source gas and the boron source gas are simultaneously supplied to the gas supply pipe.

In this example, it is thought that since the flow rate of the carbon source gas is in a lower range, the carbon source gas can not immediately reach the reaction chamber 1 via the gas supply pipe 12, thereby causing response delay. For this reason, there sometimes arises a problem that since carbon is not sufficiently doped into respective regions, the diffusion of boron occurs in the heat process after the formation of the base layer, whereby the base transit distance, concentration, and emitter/base junction position can not be controlled, or the like.

On the other hand, FIG. 7 shows the SIMS analysis result of the silicon-germanium mixed crystal layer grown by the process in this embodiment, and as already described, the gas concentration of the gas cylinder of methylsilane as the carbon source gas is 1.0% and the flow rate of the carbon source gas is controlled at approximately 9 sccm by the massflow controller 21. Moreover, the carbon source gas is supplied earlier than the boron source gas, and the supply timing of the carbon source gas from the gas cylinder 16 is earlier than the supply timing of the boron source gas from the gas cylinder 15.

By setting the supply concentration of the carbon source gas in a lower range and correspondingly gaining a higher flow rate under the condition that the doping concentration of carbon into the silicon-germanium mixed crystal layer is regulated at a predetermined concentration (0.15% in this embodiment) as stated above, the aforementioned response delay can be eliminated. Accordingly, by making the concentration of carbon equal to or higher than the concentration of boron in a region at any given depth of the silicon-germanium mixed crystal layer, the diffusion of boron in the heat process can be effectively inhibited.

The response delay of carbon with respect to boron is thought to occur at a flow rate of approximately 5 sccm or lower with respect to the flow rate of the source gas with a total quantity of 110 sccm when the diameter of the gas supply pipe is approximately 0.635 cm (¼ in.) and the length thereof is 1.5 m or longer under a pressure of $1.1 \times 10^4$ Pa (80 Torr).

Figure 8:
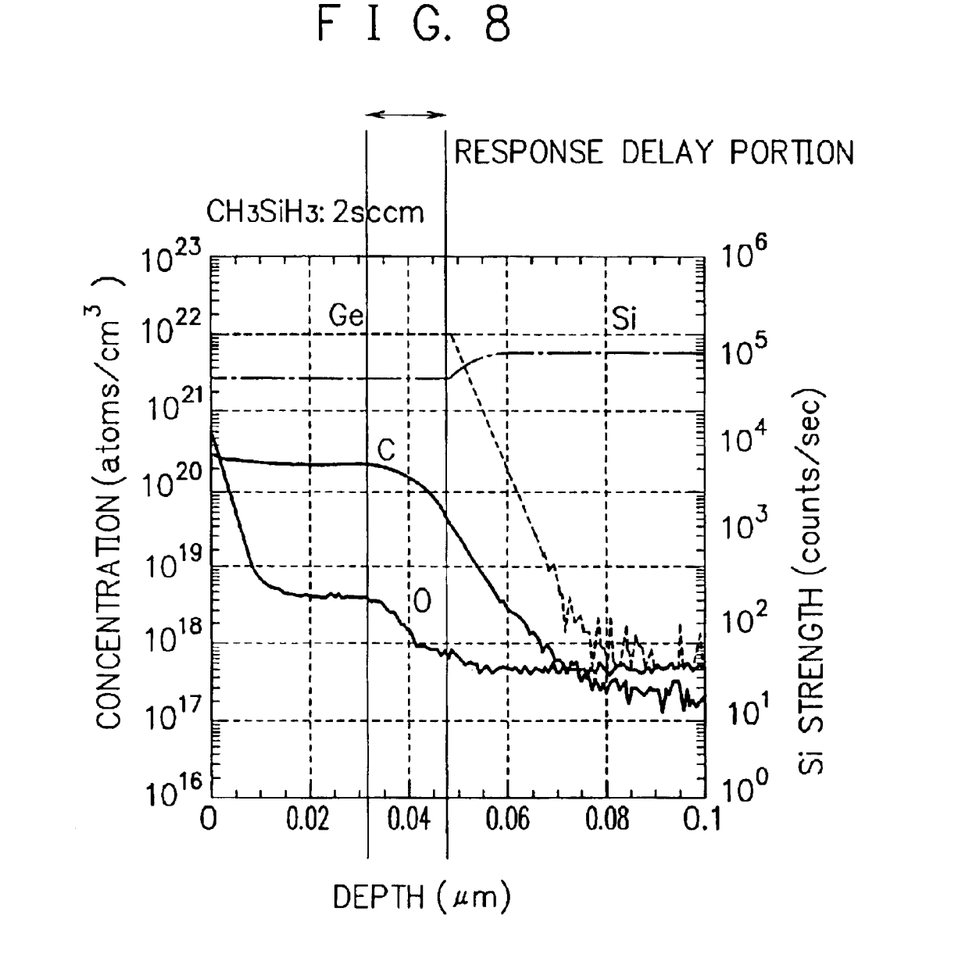
FIG. 8 is a diagram showing an SIMS analysis result of the silicon-germanium mixed crystal layer grown by simultaneously supplying monosilane, germane, and methylsilane.
Figure 9:
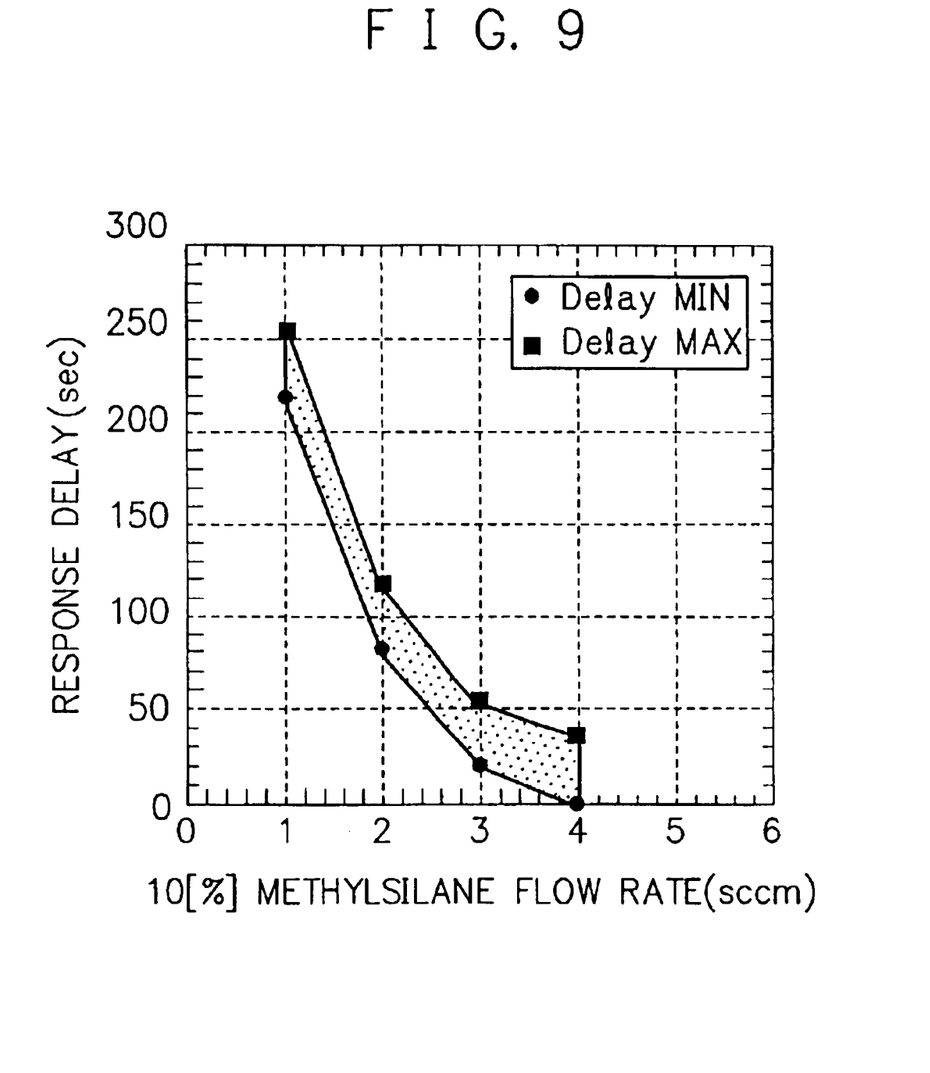
FIG. 9 is a diagram showing the relation between the flow rate of 10% methylsilane and estimated response delay [s]

Referring to FIGS. 8 and 9, an example in which the response delay time is estimated will be explained. FIG. 8 shows an SIMS analysis result of the silicon-germanium mixed crystal layer grown by simultaneously supplying monosilane as the silicon (Si) source gas, germane as the germanium (Ge) source gas, and methylsilane as the carbon (C) source gas. The result when the flow rate of 10% methylsilane as the carbon source gas is set at 2 sccm is shown in FIG. 8. In this SIMS analysis result, the response delay [s] is estimated from the distance from the depth at which the concentration of germanium is saturated to the depth at which the concentration of carbon is saturated and the deposition rate.

FIG. 9 shows the relation between the flow rate of 10% methylsilane as the carbon source gas and the response delay [s] estimated from the SIMS analysis result as stated above. For example, when the 10% methylsilane is used as the carbon source gas and carbon with a concentration of 0.3% or higher is doped into the silicon-germanium mixed crystal layer, the flow rate of the carbon source gas is sufficient if it is 2 sccm, but in this case, it is found that the response delay is large as shown in FIG. 9, and that the concentration in the layer is not uniform.

Second Embodiment

Figure 10:
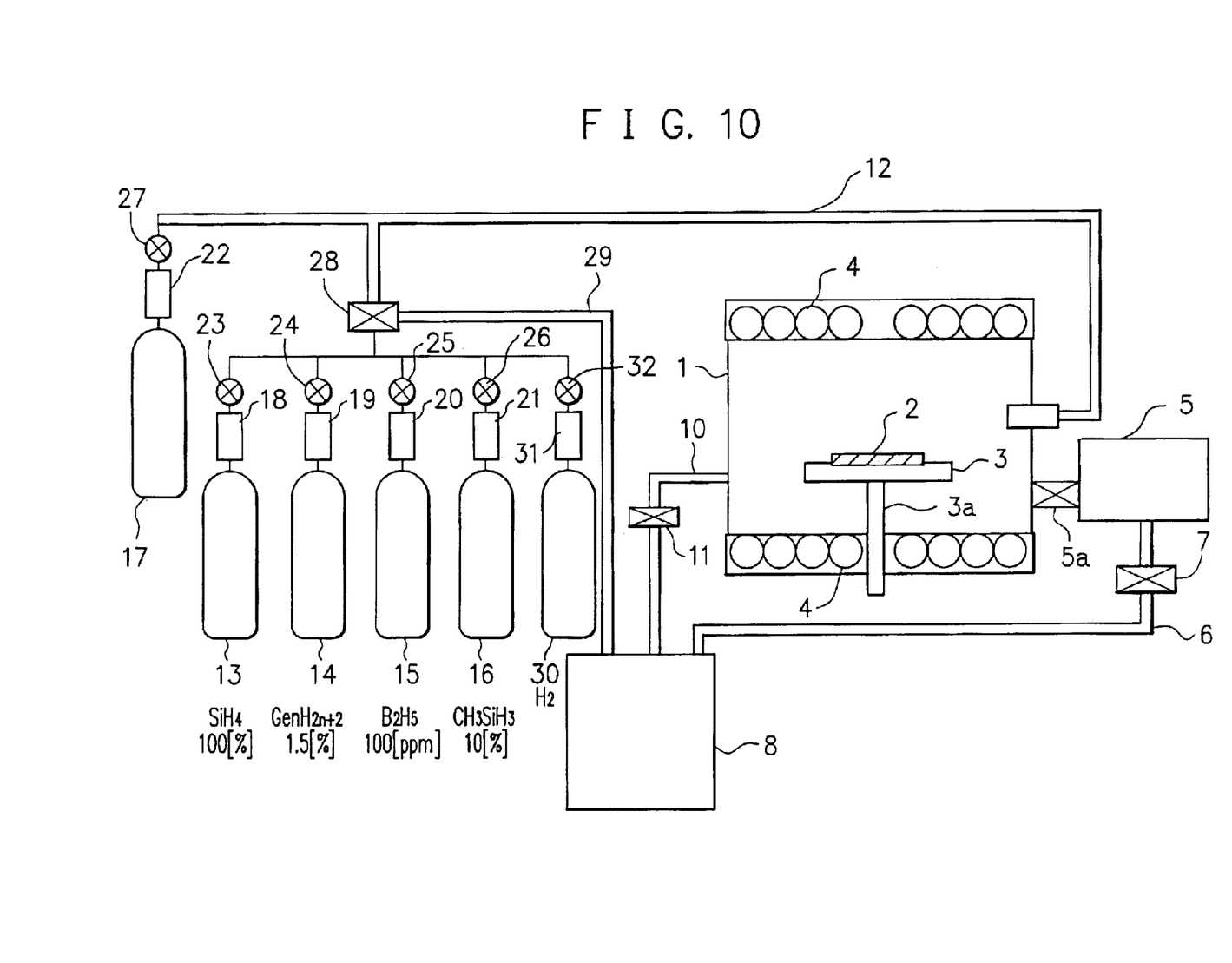
FIG. 10 is a diagram showing the schematic structure of a mixed crystal layer growing device of a second embodiment.

FIG. 10 shows the schematic structure of a mixed crystal layer growing device of the second embodiment. Only points different from the aforementioned first embodiment will be explained below, and the explanation of the same portions as those in the first embodiment is omitted.

As shown in FIG. 10, a gas cylinder 30, a massflow controller 31, and a valve 32 which compose a hydrogen gas supply unit are connected in parallel with the gas cylinder 16, the massflow controller 21, and the valve 26 which compose the carbon source gas supply unit.

Moreover, although the gas concentration of the gas cylinder of methylsilane as the carbon source gas is 1.0% in the aforementioned first embodiment, the gas concentration of methylsilane is approximately 10% in this embodiment.

In the second embodiment described above, 10% methylsilane as the carbon source gas is diluted with hydrogen gas, for example, diluted to become 1.0% methylsilane as in the aforementioned first embodiment, and then supplied to the gas supply pipe 12 from the valve 28. Therefore, as in the aforementioned first embodiment, the supply concentration of the carbon source gas is set in a lower range and correspondingly a higher flow rate is gained under the condition that the silicon-germanium mixed crystal layer is doped with carbon with a predetermined concentration (0.15% in this embodiment) so that the concentration of carbon is equal to or higher than the concentration of boron in a region at any given depth of the silicon-germanium mixed crystal layer, whereby the diffusion of boron in the heat process can be effectively inhibited.

Incidentally, although methylsilane is used as the carbon source gas in the aforementioned first and second embodiments, acetylene ($C_2H_2$), ethylene ($C_2H_4$) propene ($C_3H_6$), and the like may be used, instead. However, gases such as acetylene, ethylene, and propene need a large quantity of flow since their decomposition temperatures are higher as compared with that of methylsilane, whereby introduction efficiency is reduced. In addition, from their properties of needing a large quantity of flow, reaction products tends to adhere to the reaction chamber and the interior of the pipe, whereby they are inferior in terms of cost, maintenance, and the like.

Recently, methylsilane gas with no single bond (C—C) is regarded as mainstream. Such methylsilane has high decomposition efficiency, and hence the low-temperature growth of the silicon-germanium mixed crystal layer becomes possible. A decrease in growth temperature is essential to the improvement of the surface morphology and crystallinity of the silicon-germanium mixed crystal layer, and hence the use of methylsilane has many advantages.

Further, in the aforementioned embodiments, the silicon-germanium mixed crystal layer is epitaxially grown under a pressure from $1.3 \times 10^3$ Pa to $1.7 \times 10^4$ Pa (10 Torr to 180 Torr), because the growth speed is faster than the epitaxial growth under a high vacuum by a UHV method or the like, thereby greatly increasing productivity.

Furthermore, in the aforementioned embodiments, the silicon-germanium mixed crystal layer is epitaxially grown under a temperature from 550° C. to 750° C. mainly because of the critical thickness of the silicon-germanium mixed crystal layer. To increase the speed, a germanium concentration of 15% or higher is needed, but lattice relaxation occurs in the case of a thin layer according to the deposition temperature. In the case of 750° C., the silicon-germanium mixed crystal layer reaches the critical thickness at 20 nm, and hence it is impractical. In the case of 550° C., it is impractical from the viewpoint of productivity.

As described above, according to the present invention, for example, when the silicon-germanium mixed crystal layer is doped with boron and carbon, the diffusion of boron in the heat process can be effectively inhibited by making the concentration of carbon equal to or higher than the concentration of boron in a region at any given depth of the silicon-germanium mixed crystal layer.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A mixed crystal layer growing method comprising the steps of:

introducing source gases into the reaction chamber; and growing a silicon-germanium mixed crystal layer on a substrate placed in a reaction chamber, wherein the source gases include a silicon source gas, a germanium source gas, a first impurity source gas, and a second impurity source gas for inhibiting the diffusion or a first impurity in the mixed crystal layer, and the concentration of a second impurity is equal to or higher than the concentration of the first impurity in a region at any given depth of the silicon-germanium mixed crystal layer; wherein a supply timing from a supply source of the second impurity source gas is earlier than a supply timing from a supply source of the first impurity source gas, and a timing of stopping the supply from the supply source of the second impurity source gas is later than a timing of stopping the supply from the supply source of the first impurity source gas; and the timing of stopping the supply from the supply source of the first impurity source gas is the same as a timing of stopping a supply of the germanium source gas.

2. The mixed crystal layer growing method according to claim 1, wherein the first impurity source gas is a boron or phosphorus source gas.

3. The mixed crystal layer growing method according to claim 1, wherein the second impurity source gas is a carbon source gas.

4. The mixed crystal layer growing method according to claim 1, wherein the flow rate of the second impurity source gas is set in a higher range and the supply concentration thereof is set in a lower range under the condition that the doping concentration of the second impurity into the silicon-germanium mixed crystal layer is regulated at a certain concentration;

wherein the gas concentration of the supply source of the second impurity source gas is less than 10%; and wherein the flow rate of the second impurity source gas is 5 sccm or higher.

5. The mixed crystal layer growing method according to claim 1, wherein the respective source gases are introduced into the reaction chamber from respective gas supply sources via one gas supply pipe.

6. The mixed crystal layer growing method according to claim 5, wherein the length of the gas supply pipe is 1.5 m or longer.

7. The mixed crystal layer growing method according to claim 1, wherein the second impurity source gas from a supply source of the second impurity source gas is supplied after being diluted.

8. The mixed crystal layer growing method according to claim 1, wherein the temperature within the reaction chamber is between 550° C. and 750° C.

9. The mixed crystal layer growing method according to claim 1, wherein the pressure in the reaction chamber is between $1.3 \times 10^3$ Pa and $1.7 \times 10^4$ Pa.

10. The mixed crystal layer growing method according to claim 1, wherein hydrogen gas as a carrier gas is supplied together with the respective source gases.

11. The mixed crystal layer growing method according to claim 1, wherein the silicon-germanium mixed crystal layer is grown as a base layer of a bipolar transistor on a semiconductor substrate.

12. The mixed crystal layer growing method according to claim 1, wherein a flow rate of the germanium source gas is continuously lowered after a certain timing, and as the flow rate of the germanium source gas is controlled at 0, simultaneously a flow rate of the first impurity source gas as controlled at 0.

13. A mixed crystal layer growing method comprising the steps of:

introducing source gases into the reaction chamber; and growing a silicon-germanium mixed crystal layer on a substrate placed in a reaction chamber, wherein the source gases include a silicon source gas, a germanium source gas, a first impurity source gas, and a second impurity source gas for inhibiting the diffusion of a first impurity in the mixed crystal layer, and the concentration of a second impurity is equal to or higher than the concentration of the first impurity in a region at any given depth of the silicon-germanium mixed crystal layer; wherein a supply timing from a supply source of the second impurity source gas is earlier than a supply timing from a supply source of the first impurity source gas, and a timing of stopping a supply from a supply source of the second impurity source gas is later than a timing of stopping a supply from a supply source of the first impurity source gas, wherein the occurrence of a difference in doping depth between the dopings of the first impurity source and the second impurity source into the silicon-germanium mixed crystal layer is prevented.

* * * * *